(12) United States Patent
Saiz et al.

(10) Patent No.: US 10,340,233 B1
(45) Date of Patent: Jul. 2, 2019

(54) MILLIMETER WAVE CONNECTORS TO INTEGRATED CIRCUIT INTERPOSER BOARDS

(71) Applicant: LOCKHEED MARTIN CORPORATION, Bethesda, MD (US)

(72) Inventors: Nicholas D. Saiz, San Jose, CA (US); Xipeng Sui, Fremont, CA (US); Anthony C. Kowalczyk, San Carlos, CA (US)

(73) Assignee: Lockheed Martin Corporation, Bethesda, MD (US)

(*) Notice: Subject to any disclaimer, the term of this patent is extended or adjusted under 35 U.S.C. 154(b) by 3 days.

(21) Appl. No.: 15/371,119

(22) Filed: Dec. 6, 2016

(51) Int. Cl.
*H03H 7/38* (2006.01)
*H01L 23/66* (2006.01)
*H05K 1/02* (2006.01)
*H01P 3/08* (2006.01)
*H01P 3/02* (2006.01)
*H01L 23/498* (2006.01)
*H01L 21/48* (2006.01)
*H01P 11/00* (2006.01)

(52) U.S. Cl.
CPC .......... *H01L 23/66* (2013.01); *H01L 21/4857* (2013.01); *H01L 23/49822* (2013.01); *H01L 23/49838* (2013.01); *H01P 3/026* (2013.01); *H01P 3/08* (2013.01); *H01P 11/003* (2013.01); *H03H 7/38* (2013.01); *H05K 1/024* (2013.01); *H05K 1/025* (2013.01); *H01L 2223/6627* (2013.01); *H01L 2223/6683* (2013.01); *H05K 2201/10378* (2013.01)

(58) Field of Classification Search
CPC ........................................................ H03H 7/38
USPC ...................................................... 333/33, 34
See application file for complete search history.

(56) References Cited

U.S. PATENT DOCUMENTS

| 4,724,409 | A | 2/1988 | Lehman |
| 5,517,747 | A | 5/1996 | Pierro et al. |
| 5,583,468 | A | 12/1996 | Kielmeyer et al. |
| 5,600,181 | A | 2/1997 | Scott et al. |
| 5,768,109 | A | 6/1998 | Gulick et al. |
| 6,639,322 | B1 | 10/2003 | Welstand |
| 6,803,252 | B2 * | 10/2004 | Lao ............... H01L 23/49816 257/E23.069 |
| 6,842,093 | B2 * | 1/2005 | Tamaki ............... H01P 5/085 333/260 |
| 8,227,707 | B2 | 7/2012 | Yagisawa |

\* cited by examiner

*Primary Examiner* — Stephen E. Jones
(74) *Attorney, Agent, or Firm* — Morgan, Lewis & Bockius LLP

(57) ABSTRACT

An apparatus for connecting a millimeter wave signal to an integrated circuit includes a connector to receive the millimeter wave signal. The connector includes a signal pin. A pin landing pad is conductively coupled to the signal pin. The pin landing pad includes a transition portion. A transmission line is configured to couple the pin landing pad to an input/output (I/O) pad of an integrated circuit. The apparatus further includes an interposer including the pin landing pad, the transmission line, and the I/O pad of the integrated circuit.

12 Claims, 5 Drawing Sheets

MILLIMETER WAVE CONNECTORS TO INTEGRATED CIRCUIT INTERPOSER BOARDS

STATEMENT REGARDING FEDERALLY SPONSORED RESEARCH OR DEVELOPMENT

Not applicable

FIELD OF THE INVENTION

The present invention generally relates to integrated circuits, and more particularly, to millimeter wave connectors to integrated circuit interposer boards.

BACKGROUND

Most of the existing packagings with coaxial connectors are integrated on a printed circuit board (PCB) with surface mount technology (SMT). In SMT, electronics components are assembled by mounting directly onto the surface of the substrate. Multilayer ceramic packages have become a popular choice for microwave integrated circuits (MICs), typically in a quad flat no-leads package (QFN) form. The RF connector is launched into a transmission line that is connected to a ceramic package. Utilizing SMT, the entire components are electrically connected with solder after a high temperature reflow. This approach offers a cheap, repeatable, fast, and, reliable way for connectorized packaging at high volume, but may not be scalable in frequency. Due to the large pads and feature sizes, performance may be limited at frequency above approximately 20 GHz, and the design may become challenging. Most of the new ideas in packaging involve variations in surface mount components packaging and integration with coaxial connectors on PCB.

Another approach for package integration is using chip-on-board (COB) technique. In COB, a bare semiconductor die, which is diced from wafer, is mounted onto a PCB substrate, using an epoxy. Pads of the bare die and the substrate are interconnected by wire bond using, for example, gold or aluminum wires. The die is encapsulated afterwards for protection. COB offers key advantages over SMT, and in some areas the COB has already replaced SMT technology. By eliminating the packaging of die, COB significantly reduces the size and therefore achieves higher density and cost savings. However, long wires may introduce unwanted parasitic that can degrade performances at high frequency. The mismatches in pad sizes between die and PCB can also cause an undesirable high return loss.

A traditional method for coupling a millimeter wave connector to an integrated circuit is to use a hybrid assembly (as shown in FIG. 1) that utilizes an alumina substrate for wire-bonding to the integrated circuit. The assembly 100A of FIG. 1 includes a housing 102 (e.g., metal housing), a radio-frequency (RF) (e.g., millimeter wave) connector 104, alumina substrates 110 and 120, an integrated circuit (IC) 130, and a dielectric layer 132. The millimeter wave connector 104 is coupled (e.g., fixed) to the housing 102 and includes a connector element 106 and a pin 108. The pin 108 is conductively boded (e.g., soldered) to a metallic (e.g., gold) bond pad 112 formed over the substrate 110. The IC 130 is mounted on the dielectric layer 132 and is wire-bonded (through IC bond pads) to the metallic layer 112 using metal (e.g., gold) wires 114. The IC 130 can similarly be wire-bonded to a metallic bond pad 122 (e.g., gold) of the alumina substrate 120, using metal (e.g., gold) wires 124, from there it can be coupled to another millimeter wave connector or another IC (not shown for simplicity).

It is difficult to integrate multiple (e.g., >2) planar layers on alumina, thus, the integration complexity is lower than PCBs. In addition to integration density, alumina substrates are traditionally used with wire-bonded integrated circuits transition from the IC bond pads to alumina bond pads. This approach works well and is economical for low frequency ICs (e.g. up to 45 GHz) with few input/output (IO) pads, but does not scale well for ICs with narrow pitch pads and a large number of IO pads. In addition to scalability, bond wires introduce unwanted parasitic inductances and high characteristic impedance wave guides.

SUMMARY

According to various aspects of the subject technology, methods and configurations for integrating a printed circuit board (PCB) substrate in a hybrid microwave integrated circuit (MIC) assembly are described. In some aspects, the subject disclosure addresses the integration of an edge launch or panel mounted RF connector or feed-through with a PCB interposer used for die attach of an RF integrated circuit.

In some other aspects, an apparatus for connecting a millimeter wave signal to an integrated circuit includes a connector to receive the millimeter wave signal. The connector includes a signal pin. A pin landing pad is conductively coupled to the signal pin. The pin landing pad includes a transition portion. A transmission line is configured to couple the pin landing pad to an input/output (I/O) pad of an integrated circuit. The apparatus further includes an interposer including the pin landing pad, the transmission line, and the I/O pad of the integrated circuit.

In other aspects, a method for providing an interposer board for coupling a millimeter wave connector to an integrated circuit includes providing a connector to receive a millimeter wave signal via a signal pin. An interposer including a pin landing pad, a transmission line, and an I/O pad of the integrated circuit is provided. The pin landing pad is conductively coupled to the signal pin. The pin landing pad includes a transition portion. The pin landing pad is coupled to an I/O pad of the integrated circuit via the transmission line.

In yet other aspects, an interposer board includes a multilayer PCB including a top metallization. A pin landing pad formed using the top metallization is configured to be conductively coupled to a signal pin of a millimeter wave connector. A transmission line formed using the top metallization is configured to couple the pin landing pad to an input/output (I/O) pad of an integrated circuit. The pin landing pad includes a transition portion. Metallization from lower layers of the PCB underneath the pin landing pad are removed and replaced with a dielectric material.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to methods and configurations for integrating a PCB substrate with a hybrid MIC assembly. More specifically, this disclosure addresses the integration of an edge launch or panel mounted RF connector (e.g., millimeter wave connector) or feed through with a PCB interposer used for die attach of an integrated circuit (e.g., RFIC or MIC). The interposer board is a PCB used to interface DC and AC signals to and from the integrated circuit.

Figure 1:
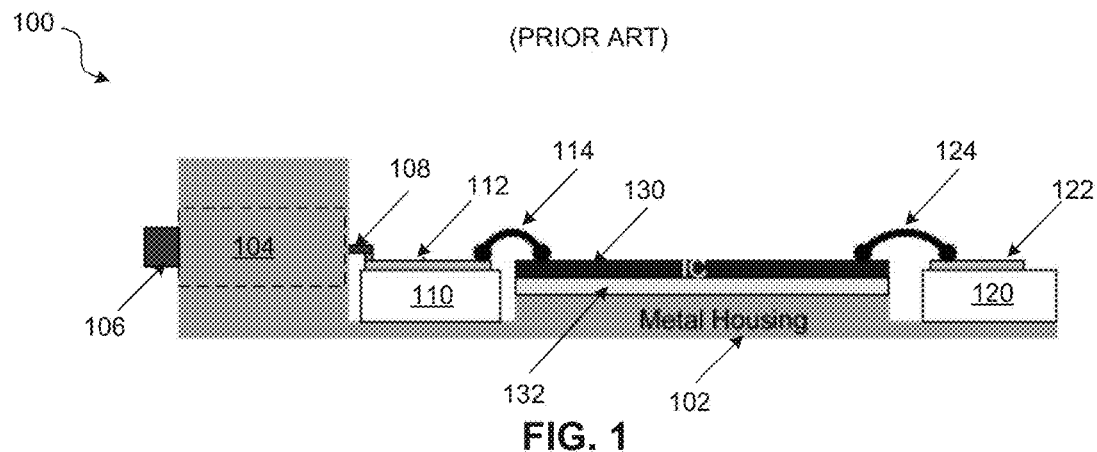
FIG. 1 is a diagram illustrating an example of a hybrid assembly for coupling a radio-frequency (RF) connector to integrated circuits using wirebonds and alumina substrates.

To circumvent the drawbacks of wirebond I/Os of FIG. 1, flip-chip I/Os have become an industry standard. A flip-chip I/O includes either solder balls, copper pillars, or other growth based interconnects applied or grown directly on the chip IO pads. Once bumps or pillars are applied to the IC IO pads, the IC is then mounted directly to an interposer board, where DC and AC signals are transmitted or received by the IC. The interposer can be encapsulated with a plastic lid forming a traditional quad flat no-leads (QFN) package, which can in turn be mounted on a larger PCB. In these applications packaged chips are typically interfaced chip to chip. The subject disclosure involves applications where an RFIC is interfaced with a normal connector (e.g., a subminiature version A (SMA) connector), to be capable of directly interfacing with RF hardware and/or test equipment.

In an RF circuit interfacing, impedance matching is crucial to guarantee maximum power transfer from a source to a load. Impedance mismatch is characterized by the reflection coefficient, $\Gamma$, that can be expressed as: $\Gamma=(Z_L-Z_o)/(Z_L+Z_o)$, where $Z_L$ is the load impedance and Zo is the characteristic impedance of a waveguide (e.g., 50Ω or 75Ω). The reflection coefficient, $\Gamma$, describes the portion of a traveling wave that is reflected by the load back to the source and is an important metric used in high-speed circuits, which quantifies the quality of impedance matching and the load impedance real and reactive components. In a desired scenario when $Z_L=Z_o$, the reflection coefficient is zero, and all of the transmitted energy is absorbed by the load. In the interface of the subject technology, impedance matching between the connector and the IC bond pad is an important consideration in configuring the interposer components.

Figure 2A:
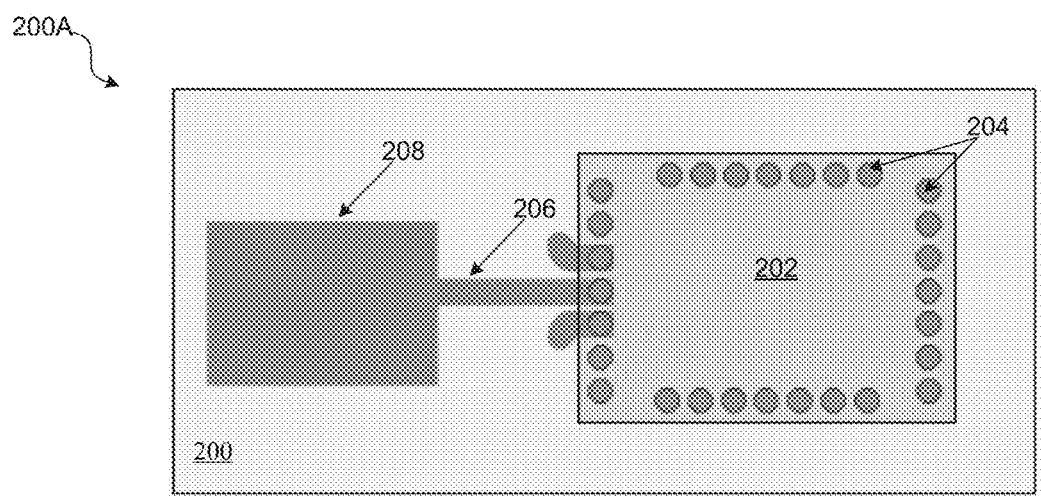
FIGS. 2A-2B are diagrams illustrating a top view and a cross-sectional view of an example interposer before being configured for coupling an RF connector to an integrated circuit, according to certain aspects of the disclosure.
Figure 2B:
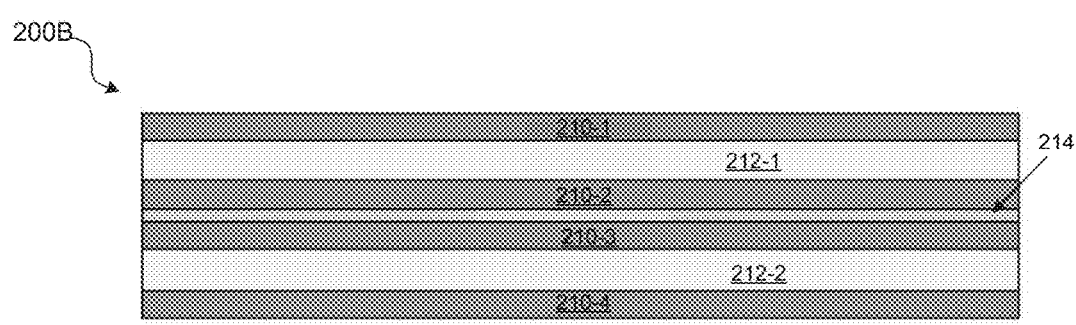

FIGS. 2A-2B are diagrams illustrating a top view 200A and a cross-sectional view 200B of an example interposer board 200 before being configured for coupling an RF connector to an integrated circuit 202, according to certain aspects of the disclosure. The interposer 200, as shown in the top view 200A, includes an integrated circuit (e.g., an RFIC or a MIC) mounting pad 202 coupled to a pin pad 208 via a transmission line 206. The integrated circuit mounting pad 202 may include multiple I/O pads 204. The pin pad 208 is intended to be coupled to a pin of an RF connector. The pin pad 208 and the transmission line 206 are formed using the top metal layer (e.g., metallization) of interposer 200. As mentioned above, the metallic pad 208, the transmission line 206, and the I/O pads 206 are to be configured to provide a desired impedance match between the metallic pad 208 and one of the I/O pads 204. In one or more embodiments, the transmission line 206 is a waveguide structure. For example, the transmission line 206 can be a stripline, a microstrip line, a coplanar waveguide, or a coplanar waveguide with ground connection.

In some embodiments, the interposer board 200, as shown in the cross-sectional view 200B, includes multiple layers including top metal layer 210-1, intermediate metal layers 210-2 and 210-3, a bottom metal layer 210-4, first dielectric layers 212 (e.g., 212-1 and 212-2), and a second dielectric layer 214. In some aspects, the metal layers 210 are copper or aluminum, the first dielectric layers 212 are FR-4 glass epoxy, and the second dielectric layer 214 is a synthetic resin (e.g., prepreg composite). The interposer board 200 can provide higher integration, as it allows routing many signal layers compared to conventional alumina substrates. Among other features, the thickness of the multilayer interposer board 200 is suitable for geometries that work with 50 ohm transmission lines, which match RFIC or MIC pad geometries. The pin pad 208, however, is considerably larger than the geometry suitable for a 50 Ohm transmission line and creates an unacceptable impedance mismatch (e.g., >5%) resulting in reflections and signal degradation. The subject technology make suitable changes to the interposer board 200 and the pin pad 208 to solve the problem of unacceptable impedance mismatch.

Figure 3A:
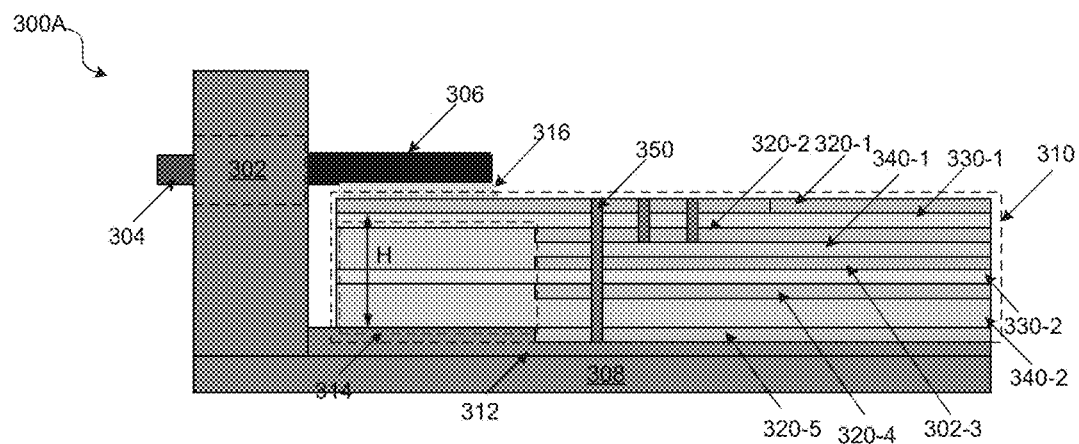
FIGS. 3A-3B are diagrams illustrating a cross-sectional view and a top view and of an example interposer configured for coupling a millimeter wave connector to one or more integrated circuits, according to certain aspects of the disclosure.
Figure 3B:
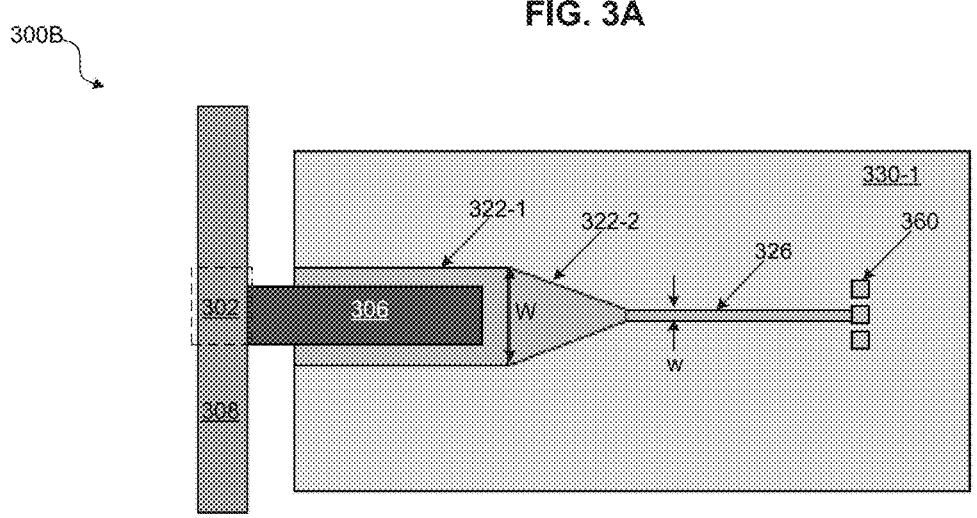

FIGS. 3A-3B are diagrams illustrating a cross-sectional view and a top view and of an example interposer 310 configured for coupling an RF connector to one or more integrated circuits, according to certain aspects of the disclosure. The cross-sectional view 300A shows the interposer (e.g., multi-layer PCB) 310 coupled via a conductive epoxy 312 to a housing 308. An RF connector 302 (e.g., a millimeter wave connecter, such as a SMA connector) is coupled (e.g., fixed) to a side wall of the housing 308. The RF connector 302 includes a connector element 303 for connection to a signal source and a pin 306 (e.g., a signal pin). The pin 306 is coupled to a top metal layer (e.g., 320-1) of the multi-layer PCB 310 via a conductive bonding 316 (e.g., a solder). In some aspects, the multi-layer PCB 310 includes metal layers 320 (e.g., 320-1, 320-2 . . . 320-5), first dielectric layers 330 (e.g., 330-1 and 330-2), and second dielectric layer 340 (e.g., 340-1 and 340-2). In some aspects, the metal layers 320 are copper or aluminum, the first dielectric layers 330 are FR-4 glass epoxy, and the second dielectric layers 340 are a synthetic resin (e.g., prepreg composite), which has a dielectric constant matching (e.g., within 10%) the dielectric constant of the first dielectric material. As seen from FIG. 3A, the subject technology increases the height H of the dielectric material in the area 314 underneath the pin 306 (e.g., under a pin landing pad 322-1 shown in the top view 300B). This is done by removing portions of PCB metallization's (e.g., metal layers 320-2 through 320-5) that are within a region represented by the cross-section area 314. Various metal layers 320 are connected to one another using conductive vias 350.

The top view 300B shows the wall of the housing 308 holding the RF connector 302, the pin 306 of the RF connector 302, and the dielectric layer 330-1, on the top metal layer (e.g., 320-1) is patterned to form the pin landing pad 322, a transmission line 326 and I/O pads 360 of an integrated circuit (e.g., an RFIC or an MIC). The pin landing pad 322 includes a wide portion 322-1 (e.g., with a width W) and a transition portion 322-2 that has a width tapered to match a larger width W (e.g., within the range of about 200-300 μm, such as 250 μm) to a smaller width w (e.g., within the range of about 40-60 μm, such as 50 μm) of the transmission line 326. In some embodiments, the portion 322-1 can be called the pin landing pad and the portion 322-2 can be called a transition layer. In one or more embodiments, the transmission line 326 is a waveguide structure. For example, the transmission line 326 can be a stripline, a microstrip line, a coplanar waveguide, or a coplanar waveguide with ground connection.

The increased height H of the dielectric material under the pin landing pad 322, as shown in FIG. 3A, allows larger width W of the pin landing pad 322, while accommodating the characteristic impedance (Zo) of approximately 50Ω for a desired impedance match to the I/O pads 360. The characteristic impedance (Zo) for a transmission line is related to the width w of the signal conductor and the thickness d of the dielectric layer (between the signal conductor and the ground layer) and can be expressed as:

$$Z_o = \frac{60}{\sqrt{\varepsilon_e}} \ln\left(\frac{8d}{W} + \frac{W}{4d}\right), \frac{W}{d} \leq 1 \quad (1)$$

$$Z_o = \frac{120\pi}{\sqrt{\varepsilon_e}\left[\frac{W}{d} + 1.393 + 0.667\ln\left(\frac{W}{d} + 1.444\right)\right]}, \frac{W}{d} \geq 1 \quad (2)$$

A plot of the above expressions are shown and discussed below with regard to FIG. 5 below. Using the above expressions, it can be shown that for a fixed dielectric constant E, a specific $Z_o$ can be achieved by adjusting the W/d ratio. For example, a ratio of w/d of approximately 2.45 allows achieving 50Ω characteristic impedance, which demonstrates the need for the height H (thickness of the dielectric layer) of FIG. 3A to be about 100 μm (e.g., W/2.45 or 250/2.45~100). For the transmission line 326, with a width w of about 50 μm, the thickness of the dielectric layer 330-1 can be about 20 μm (e.g., w/2.45 or 50/2.45~20).

Figure 4:
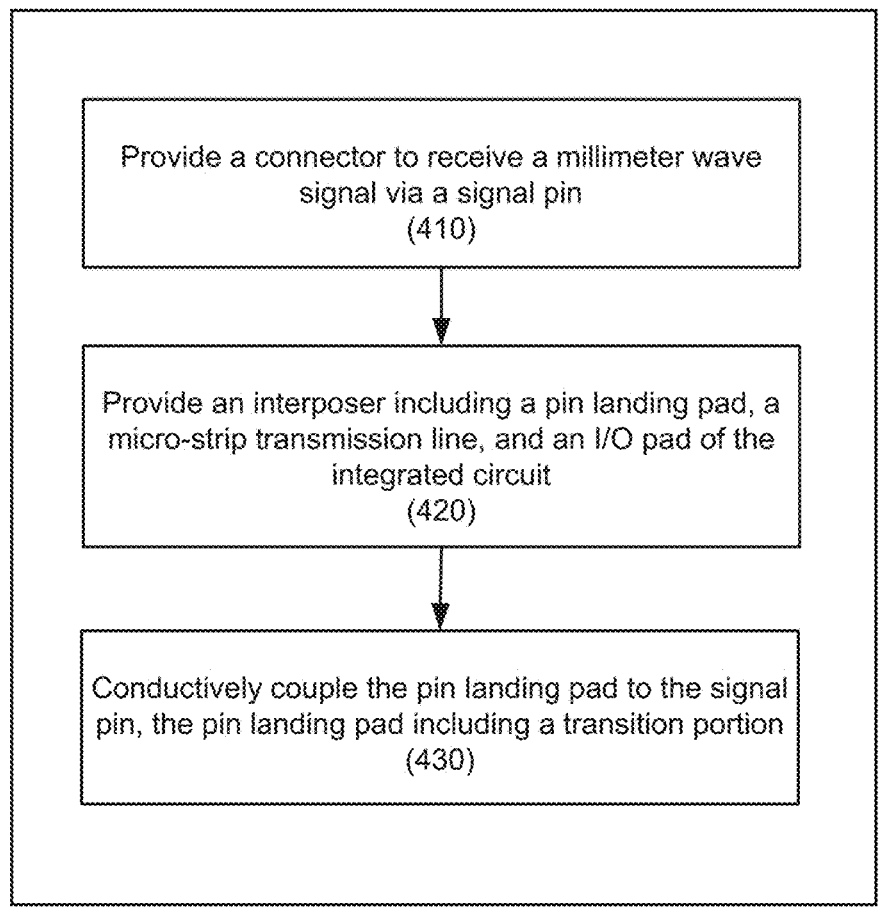
FIG. 4 is a flow diagram illustrating an example of a method for providing an interposer board for coupling an RF connector to an integrated circuit, according to certain aspects of the disclosure.

FIG. 4 is a flow diagram illustrating an example of a method 400 for providing an interposer board for coupling a RF connector to an integrated circuit according to certain aspects of the disclosure. The method 400 begins with providing a connector (e.g., 302 of FIG. 3A) to receive an RF (e.g., a millimeter wave) signal via a signal pin (e.g., 306 of FIG. 3A) (410). An interposer (e.g., 310 of FIG. 3A) including a pin landing pad (e.g., 322 of FIG. 3B), a transmission line (e.g., 326 of FIG. 3B), and an I/O pad (e.g., 360 of FIG. 3B) of the integrated circuit (e.g., 130 of FIG. 1) is provided (420). The pin landing pad is conductively coupled to the signal pin (430). The pin landing pad includes a transition portion (e.g., 322-2 of FIG. 3B). The pin landing pad is coupled to an I/O pad of the integrated circuit via the transmission line.

Figure 5:
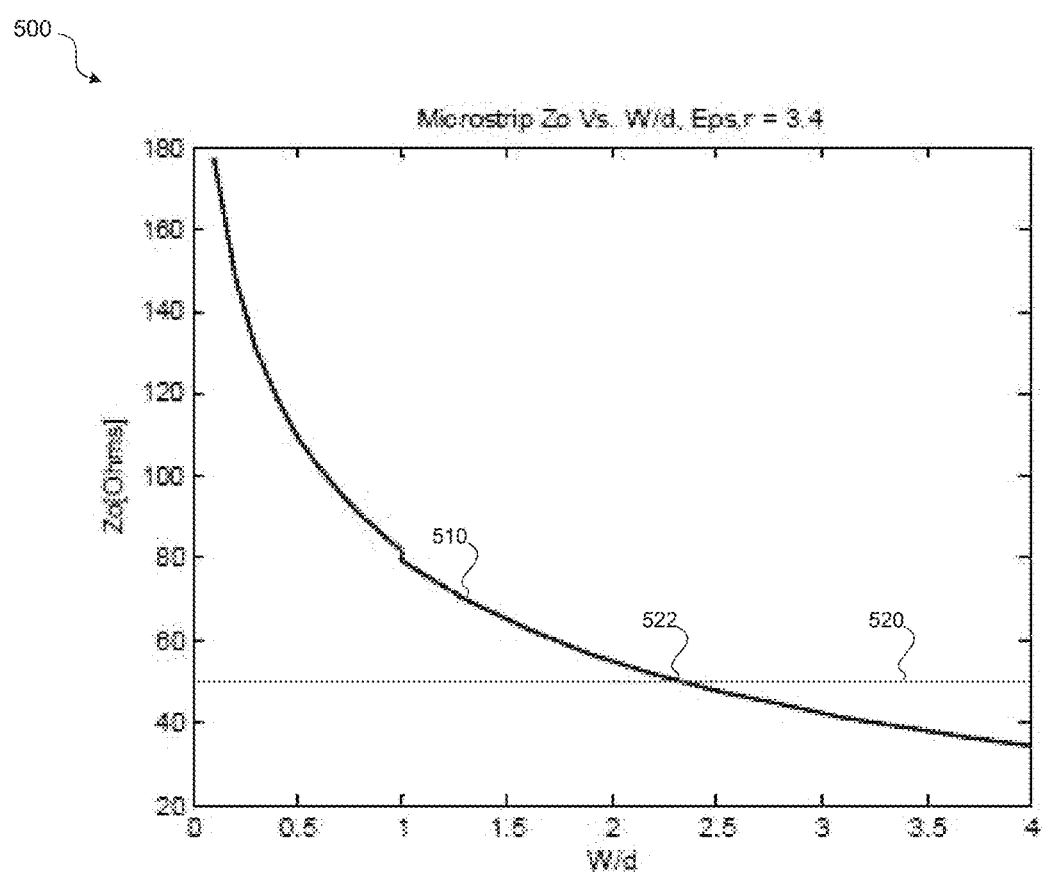
FIG. 5 is a chart illustrating an example variation of a characteristic impedance (Zo) versus width/length (w/d) ratio for a transmission line.

FIG. 5 is a chart 500 illustrating an example variation of a characteristic impedance (Zo) versus width/length (w/d) ratio for a line. The chart 500 shows the graph 510 and a horizontal line 520. The graph 510 is a plot of the expressions (1) and (2) versus the ratio of w/d, as explained above, for a value of dielectric constant of about 3.4. The horizontal line 520 corresponds to a constant Zo of 50Ω. The horizontal line 520 crosses the graph 510 at a point 522 characterized by a value of about 2.45 for w/d. For values of w/d less than about 2.45, the characteristic impedance is higher than 50Ω, and values of w/d larger than about 2.45 decrease the characteristic impedance to values lower than 50Ω.

Figure 6:
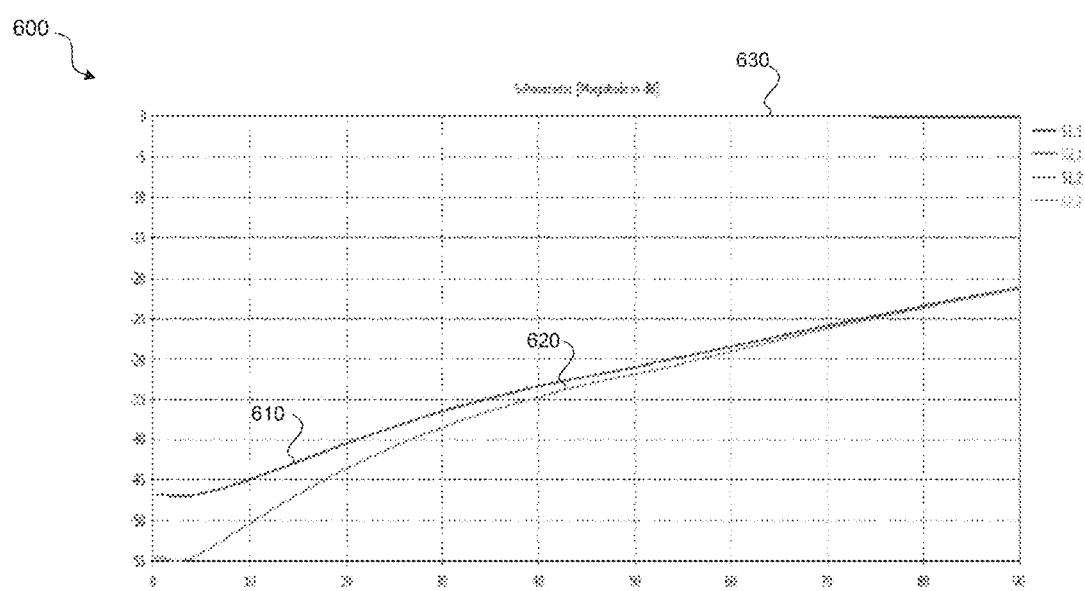
FIG. 6 is a chart illustrating example variations of S-parameters versus frequency for an exemplary interposer of the subject technology.

FIG. 6 is a chart 600 illustrating example variations of S-parameters versus frequency for an exemplary interposer of the subject technology. The S-parameters shown in the chart 600 are S11 (input port voltage reflection coefficient), S12 (reverse voltage gain), S21 (forward voltage gain), and S22 (output port voltage reflection coefficient). The input and output ports refer to the input and output ports of the transpose board, for example, the pin 306 and I/O pad 360, respectively, of FIG. 3B. Plots 610 and 620 show variations of S11 and S22, respectively, and plot 630 shows variation of S12. The S-parameter values are expressed in dB, and the frequency values of the horizontal axis are in GHz. The plots show that the return loss (e.g., S22) remains below 15 dB for frequencies of up to about 100 GHz.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. An apparatus comprising:
   a connector to receive a millimeter wave signal, the connector including a signal pin;
   a pin landing pad conductively coupled to the signal pin, the pin landing pad including a transition portion;
   a transmission line coupling the pin landing pad to an input/output (I/O) pad of an integrated circuit; and
   an interposer comprising a multilayer printed circuit board (PCB) comprising metallization layers and dielectric layers and including the pin landing pad, the transmission line, and the I/O pad of the integrated circuit, wherein a metallization under the pin landing pad is removed and a dielectric material of the dielectric layers comprises prepreg.

2. The apparatus of claim 1, wherein the signal pin is coupled to the pin landing pad using one of a conductive bonding material or a solder, wherein the solder comprises a metal alloy including tin and lead, and wherein the transmission line comprises a waveguide structure including one of a stripline, a microstrip line, a coplanar waveguide, or a coplanar waveguide with ground connection.

3. The apparatus of claim 1, wherein the transition portion of the pin landing pad is tapered and is configured to match a width, W, of the pin landing pad with a width, w, of the transmission line.

4. The apparatus of claim 3, wherein the width, W, of the pin landing pad is within a range of about 200-300 µm, and wherein the width, w, of the transmission line is within a range of 40-60 µm.

5. The apparatus of claim 1, wherein the metallization layers of the multilayer PCB are removed from areas of the multilayer PCB underneath the pin landing pad to provide a height, H, of a dielectric material between the pin landing pad and a ground plane of the interposer.

6. The apparatus of claim 5, wherein the removed metallization layers are replaced with the dielectric material.

7. The apparatus of claim 5, wherein a dielectric constant of the dielectric material matches within a range of about 10% with a dielectric constant of a PCB core of the interposer.

8. The apparatus of claim 5, wherein a width, W, of the pin landing pad and the height, H, of dielectric material are configured to provide, within a range of about 5%, a desired impedance match between the signal pin and the I/O pad of the integrated circuit.

9. The apparatus of claim 8, wherein the integrated circuit comprises one of a radio-frequency integrated circuit (RFIC) or a microwave integrated circuit (MIC).

10. An interposer board comprising:
    a multilayer printed circuit board (PCB) including a top metallization;
    a pin landing pad formed using the top metallization and conductively coupled to a signal pin of a millimeter wave connector; and
    a transmission line formed using the top metallization and coupling the pin landing pad to an input/output (I/O) pad of an integrated circuit,
    wherein the pin landing pad includes a transition portion, and
    metallization from lower layers of the PCB underneath the pin landing pad are removed and replaced with a dielectric material comprising prepreg.

11. The interposer board of claim 10, wherein the transition portion of the pin landing pad is tapered and is configured to match a width, W, of the pin landing pad with a width, w, of the transmission line.

12. The interposer board of claim 11, wherein the width, W, of the pin landing pad and a height, H, of a dielectric material between the pin landing pad and a ground plane are configured to provide, within a range of about 5%, a desired impedance match between the signal pin and the I/O pad of the integrated circuit.

* * * * *